United States Patent
Choi et al.

(10) Patent No.: US 9,589,905 B2
(45) Date of Patent: Mar. 7, 2017

(54) EMI SHIELDING IN SEMICONDUCTOR PACKAGES

(71) Applicant: SK HYNIX INC., Icheon (KR)

(72) Inventors: Hyung Ju Choi, Seoul (KR); Jong Hyun Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/245,967

(22) Filed: Apr. 4, 2014

(65) Prior Publication Data

US 2015/0129874 A1    May 14, 2015

(30) Foreign Application Priority Data

Nov. 14, 2013    (KR) .................. 10-2013-0138628

(51) Int. Cl.
| | | |
|---|---|---|
| H01L 23/552 | (2006.01) | |
| H01L 21/66 | (2006.01) | |
| H01L 23/31 | (2006.01) | |
| H01L 23/00 | (2006.01) | |
| H01L 25/065 | (2006.01) | |

(52) U.S. Cl.
CPC ............ *H01L 23/552* (2013.01); *H01L 22/32* (2013.01); *H01L 23/3121* (2013.01); *H01L 23/3135* (2013.01); *H01L 24/32* (2013.01); *H01L 24/48* (2013.01); *H01L 24/73* (2013.01); *H01L 25/0657* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06537* (2013.01); *H01L 2225/06562* (2013.01); *H01L 2225/06596* (2013.01); *H01L 2924/00014* (2013.01); *H01L 2924/1431* (2013.01); *H01L 2924/1434* (2013.01); *H01L 2924/1531* (2013.01); *H01L 2924/15192* (2013.01); *H01L 2924/181* (2013.01); *H01L 2924/19107* (2013.01); *H01L 2924/3025* (2013.01)

(58) Field of Classification Search
CPC .............................. H01L 22/32; H01L 23/552
USPC .......................................... 257/659, E23.114
See application file for complete search history.

(56) References Cited

U.S. PATENT DOCUMENTS

| | | | | |
|---|---|---|---|---|
| 8,084,300 B1 * | 12/2011 | San Antonio | ......... | H01L 21/561 257/E21.602 |
| 2011/0115060 A1 * | 5/2011 | Chiu | ..................... | H01L 21/568 257/660 |
| 2011/0304015 A1 * | 12/2011 | Kim | ..................... | H01L 23/552 257/532 |

FOREIGN PATENT DOCUMENTS

KR    10-2011-0135294 A    12/2011

* cited by examiner

*Primary Examiner* — Eduardo A Rodela
*Assistant Examiner* — Christopher M Roland (57) ABSTRACT

A semiconductor package includes a substrate, a chip disposed over a top surface of the substrate, an electromagnetic interference (EMI) shielding layer disposed over the substrate such that the EMI shielding layer surrounds the chip, a ground pad disposed in the substrate to contact a bottom surface of the substrate, and a test pad disposed in the substrate to contact the bottom surface of the substrate and spaced apart from the ground pad. A method of testing the semiconductor package is performed using a loop circuit to which a current is applied, the loop circuit being formed by electrically coupling the ground pad, the EMI shielding layer, and the test pad.

3 Claims, 7 Drawing Sheets

EMI SHIELDING IN SEMICONDUCTOR PACKAGES

CROSS-REFERENCE TO RELATED APPLICATION

The present application claims priority under 35 U.S.C 119(a) to Korean Patent Application No. 10-2013-0138628, filed on Nov. 14, 2013, in the Korean Intellectual Property Office, which is hereby incorporated by reference in its entirety.

BACKGROUND

1. Technical Field

Embodiments of the present disclosure relate to semiconductor packages and, more particularly, to semiconductor packages having EMI shielding layers.

2. Related Art

Electromagnetic interference (EMI) means a phenomenon that high frequency noise generated from electronic circuits or electronic systems affects the performance of other circuits or other systems. EMI may also adversely affect humans. Typically, attempts to suppress EMI include designing electronic circuits (or electronic systems) to prevent the generation of high frequency noise, shielding the electronic circuits (or the electronic systems) to prevent the propagation of high frequency noise, and so on.

SUMMARY

Various embodiments are directed to semiconductor packages having EMI shielding layers, methods of testing the semiconductor packages, electronic systems including the semiconductor packages, and memory cards including the semiconductor packages.

In some embodiments, a semiconductor package includes a substrate, a chip disposed on a top surface of the substrate, an electromagnetic interference (EMI) shielding layer disposed on the substrate such that the EMI shielding layer surrounds the chip, a ground pad disposed on a bottom surface of the substrate, and a test pad disposed on the bottom surface of the substrate that is spaced apart from the ground pad.

In some embodiments, a semiconductor package includes a substrate, a first chip disposed on a top surface of the substrate, an electromagnetic interference (EMI) shielding layer disposed on a surface of the first chip opposite to the substrate, a second chip disposed on a surface of the EMI shielding layer opposite to the first chip, a ground pad disposed on a bottom surface of the substrate, and a test pad disposed on the bottom surface of the substrate that is spaced apart from the ground pad.

In some embodiments, a method of testing a semiconductor package includes forming a loop circuit by disposing a ground pad and a test pad on a bottom surface of a substrate, disposing an electromagnetic interference (EMI) shielding layer on a top surface of the substrate such that the EMI shielding layer surrounds the chip, detecting a resistance value of the loop circuit, and determining an electrical connection state of the loop circuit according to the detecting resistance value of the loop circuit.

In some embodiments, an electronic system includes a memory and a controller coupled with the memory via a bus. The memory or the controller includes a substrate, a chip disposed on a top surface of the substrate, an electromagnetic interference (EMI) shielding layer disposed on the substrate such that the EMI shielding layer surrounds the chip, a ground pad disposed on a bottom surface of the substrate, and a test pad disposed on the bottom surface of the substrate that is spaced apart from the ground pad.

In some embodiments, an electronic system includes an interface, a memory coupled with the interface via a bus, and a controller coupled with the interface and the memory via the bus. The memory or the controller includes a substrate, a first chip disposed on a top surface of the substrate, an electromagnetic interference (EMI) shielding layer disposed on a surface of the first chip opposite to the substrate, a second chip disposed on a surface of the EMI shielding layer opposite to the first chip, a ground pad disposed on a bottom surface of the substrate, and a test pad disposed on the bottom surface of the substrate that is spaced apart from the ground pad.

In some embodiments, a memory card includes a memory component and a memory controller that controls operation of the memory component. The memory component includes a substrate, a chip disposed on a top surface of the substrate, an electromagnetic interference (EMI) shielding layer disposed on the substrate such that the EMI shielding layer surrounds the chip, a ground pad disposed on a bottom surface of the substrate, and a test pad disposed on the bottom surface of the substrate that is spaced apart from the ground pad.

BRIEF DESCRIPTION OF THE DRAWINGS

Embodiments of the present invention will become more apparent in view of the attached drawings and accompanying detailed description, in which.

DESCRIPTION OF SPECIFIC EMBODIMENTS

Figure 1:
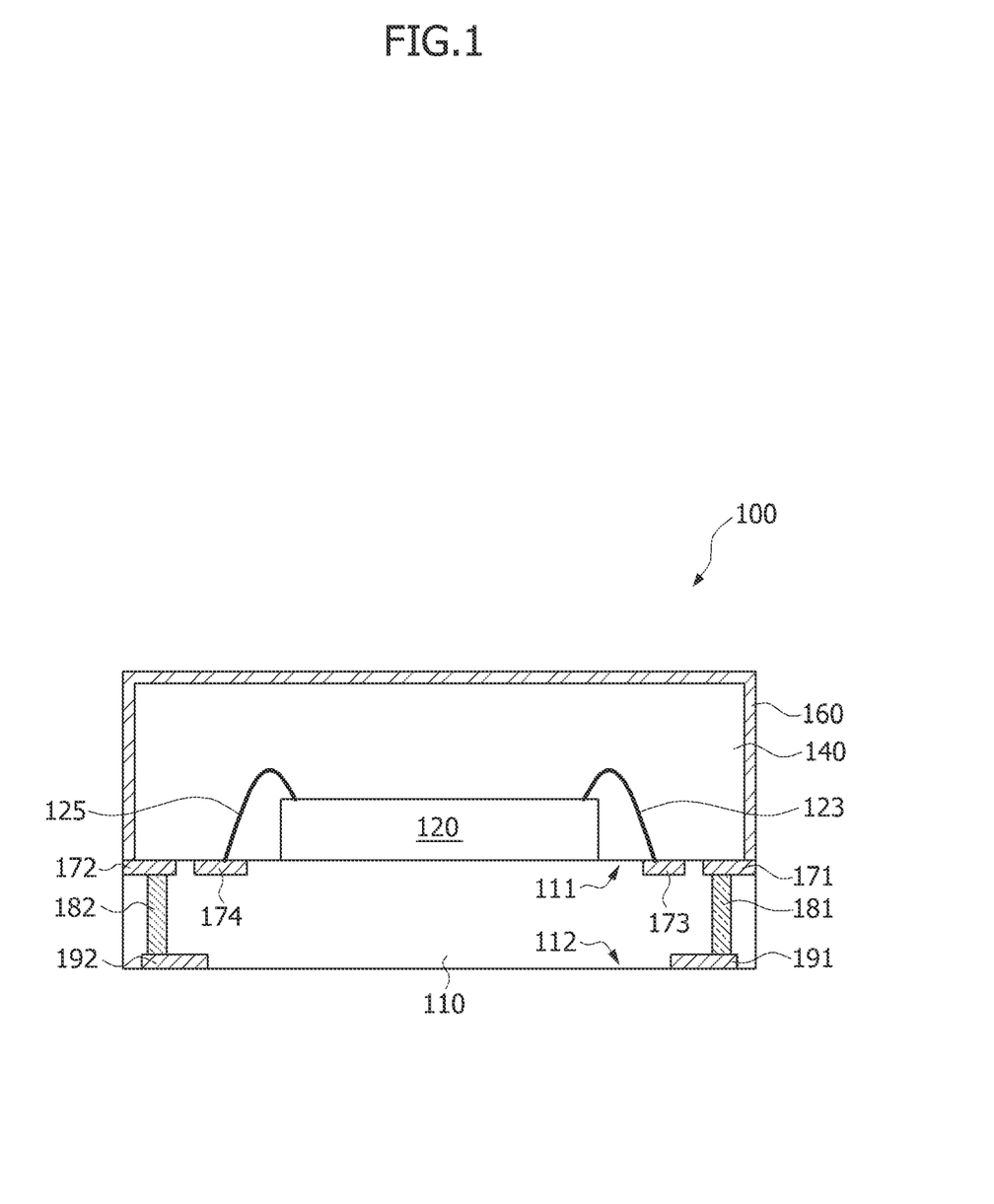
FIG. 1 is a cross-sectional view illustrating a semiconductor package according to an embodiment of the present invention.
Figure 2:
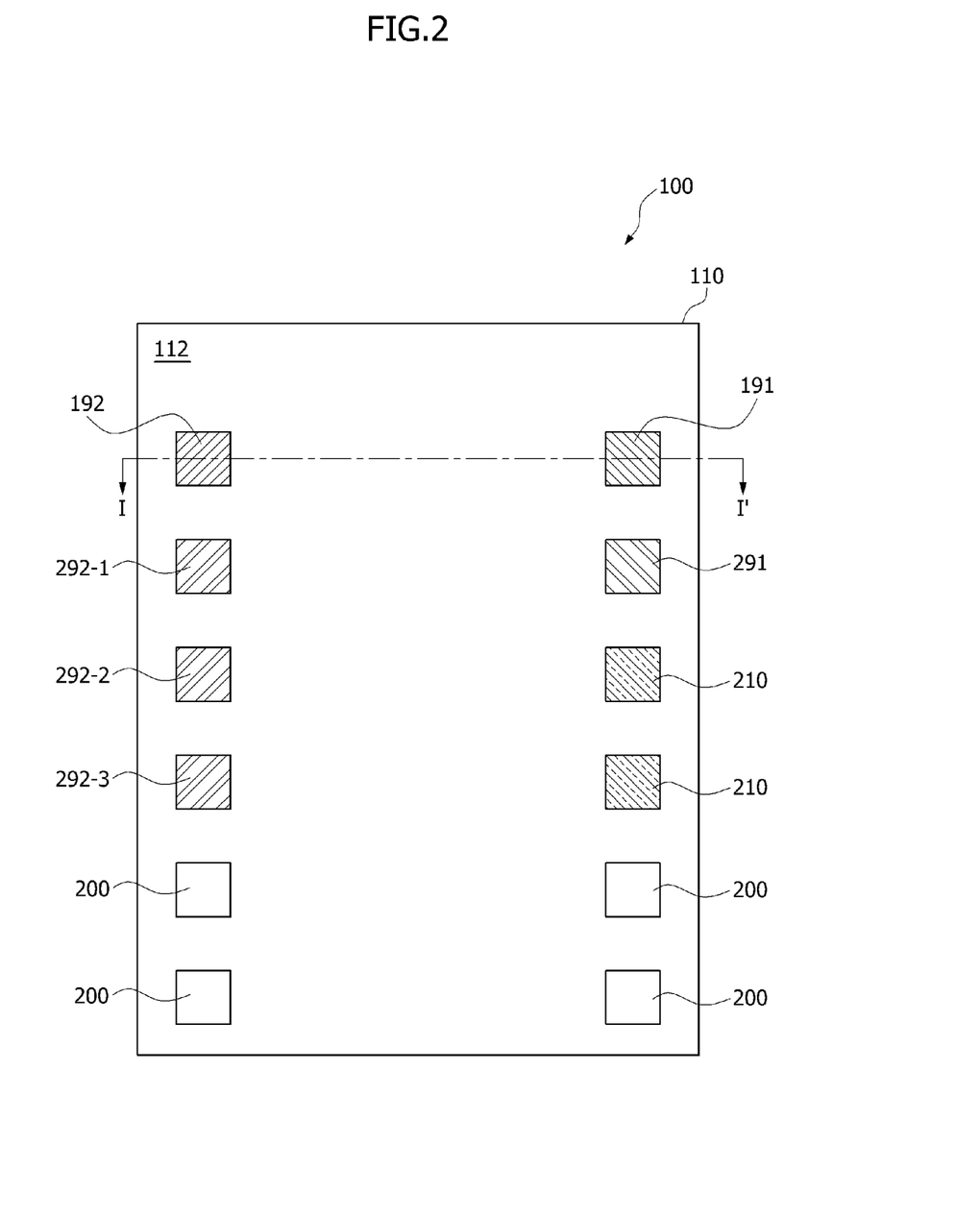
FIG. 2 is a bottom plan view illustrating a pad layout of the semiconductor package shown in FIG. 1.

FIG. 1 is a cross-sectional view of a semiconductor package 100 (taken along line I-I' of FIG. 2) according to an embodiment of the present invention, and FIG. 2 is a bottom plan view of a pad layout of the semiconductor package 100. Referring to FIGS. 1 and 2, the semiconductor package 100 includes a substrate 110 having a top surface 111 and a bottom surface 112, a chip 120 mounted on the top surface 111 of the substrate 110, an EMI shielding layer 160 disposed over the substrate 110 such that the EMI shielding layer 160 surrounds the chip 120, a ground pad 191 disposed on the bottom surface 112 of the substrate 110, and a test pad 192 disposed on the bottom surface 112 of the substrate 110 that is spaced apart from the ground pad 191. In some embodiments, the ground pad 191 and the test pad 192 may be insulated from each other. The test pad 192 may be a test ground pad for testing the EMI shielding layer 160.

In some embodiments, the substrate 110 is used to electrically connect the chip 120 to a mother board (not shown). That is, when the chip 120 is disposed on the top surface 111 of the substrate 110, the mother board may be electrically connected to the bottom surface 112 of the substrate 110. Although not shown in the Figures, an interconnection structure that includes various electrical signal paths may be disposed in, on, and/or within the substrate 110. In some embodiments, the substrate 110 may be electrically coupled to another semiconductor package so that the semiconductor package 100 constitutes a package-on-package (PoP) module with another semiconductor package.

One or more bonding pads e.g., a first bonding pad 171, a second bonding pad 172, a third bonding pad 173 and a fourth bonding pad 174, may be disposed on the top surface 111 of the substrate 110. As shown in FIG. 1, the first bonding pad 171 contacts one end of the EMI shielding layer 160 and the second bonding pad 172 contacts the other end of the EMI shielding layer 160. The third and fourth bonding pads 173 and 174 are electrically coupled to the chip 120, such as via bonding wires 123 and 125, respectively. Although FIG. 1 illustrates four bonding pads 171, 172, 173 and 174, additional bonding pads may be utilized in another embodiment.

As described herein, the chip 120 is disposed on the top surface 111 of the substrate 110. Although not shown in the Figures, an adhesion layer may be disposed between the substrate 110 and the chip 120. In some embodiments, the chip 120 may be a logic chip such as a controller chip. In another embodiment, the chip 120 may be a memory chip. The chip 120 is electrically coupled to the third bonding pad 173 through the first bonding wire 123. Furthermore, the chip 120 is electrically coupled to the fourth bonding pad 174 through the second bonding wire 125.

The chip 120, the first bonding wire 123, and the second bonding wire 125 are surrounded by an insulation layer 140. In some embodiments, the insulation layer 140 may be a molding layer. In another embodiment, the insulation layer 140 may be an adhesion layer, such as a penetration wafer backside lamination (PWBL) tape, a P-spacer, and so on.

The EMI shielding layer 160 is disposed on the insulation layer 140. The EMI shielding layer 160 may include a conductive layer such as a metal layer. The EMI shielding layer 160 may have a single layered structure or a multi-layered structure. As illustrated in FIG. 1, the EMI shielding layer 160 may be disposed to directly contact and surround (e.g., completely, substantially, or partially) the insulation layer 140.

Figure 1A:
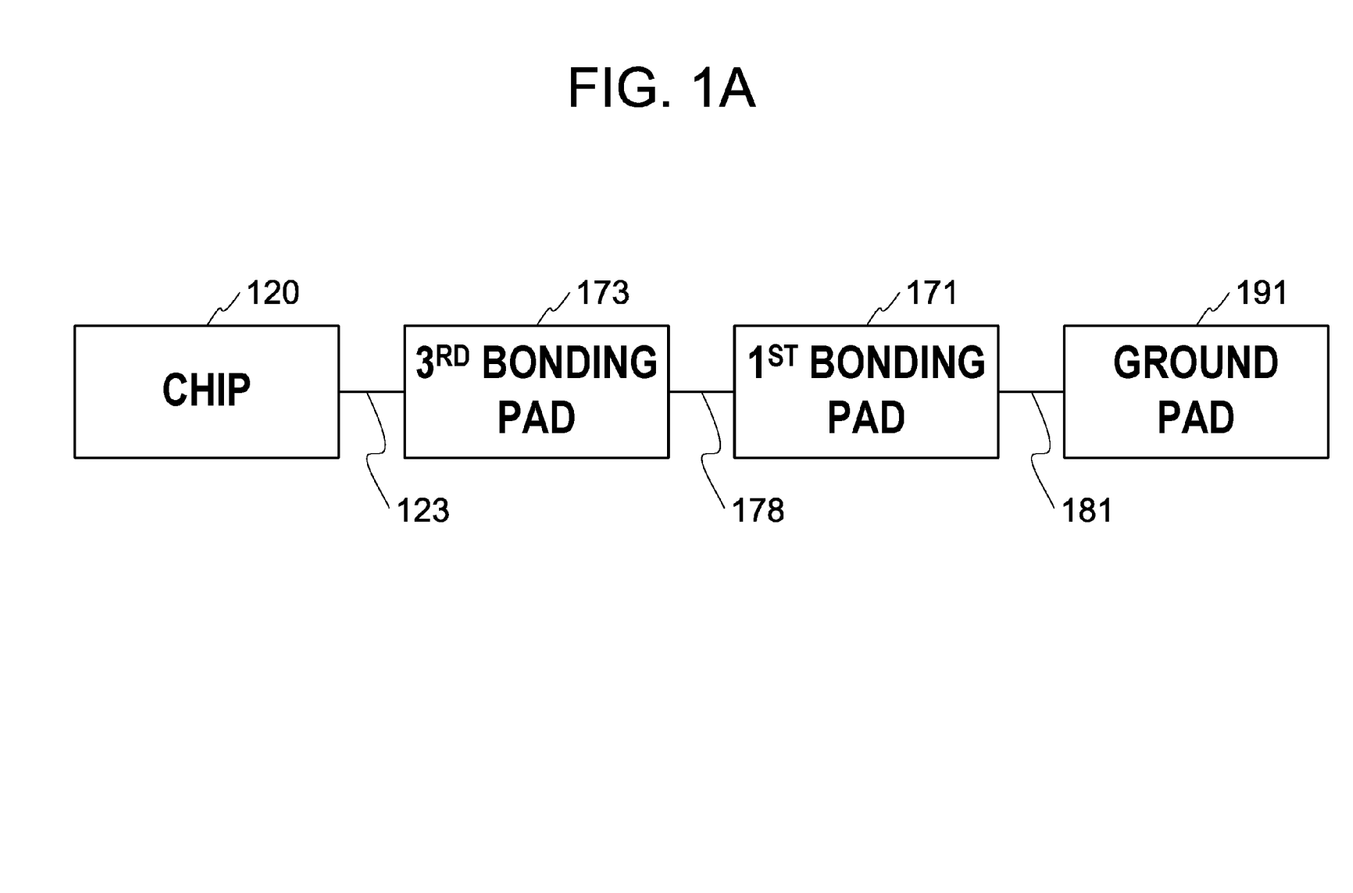
FIG. 1A illustrates connections between bonding pads in the semiconductor package of FIG. 1 according to another embodiment of the present invention.

However, in some embodiments, another layer such as a heat radiation layer may be disposed between the EMI shielding layer 160 and the insulation layer 140. In another embodiment, as shown in FIG. 1A, the first bonding pad 171, which contacts one end of the EMI shielding layer 160, may be electrically coupled to the third bonding pad 173, which is connected to the first bonding wire 123, through an interconnection line 178 disposed in the substrate 110. In still another embodiment, one of the bonding wires connected to the chip 120 may be directly connected to the first bonding pad 171, which contacts the EMI shielding layer 160.

The ground pad 191 and the test pad 192 are disposed on the bottom surface 112 of the substrate 110. The ground pad 191 is electrically coupled to the first bonding pad 171 through a first interconnection line 181 disposed in the substrate 110. Thus, in some embodiments, the ground pad 191 is electrically coupled to the EMI shielding layer 160 via the first bonding pad 171 and the first interconnection line 181. Although not shown in the Figures, in another embodiment, the ground pad 191 may also be electrically coupled to the chip 120 through a bonding wire connected to the first bonding pad 171.

In some embodiments, the ground pad 191 is electrically coupled to the chip 120 through a bonding wire connected to another bonding pad, such as the third bonding pad 173. For example, the third bonding pad 173 may be connected to the first bonding pad 171 through the interconnection line 178 disposed in the substrate 110 as illustrated in FIG. 1A.

The test pad 192 may be electrically coupled to the second bonding pad 172 in the substrate 110 through a second interconnection line 182. Thus, in some embodiments, the test pad 192 is electrically coupled to the EMI shielding layer 160 via the second bonding pad 172 and the second interconnection line 182. Each of the first and second interconnection lines 181 and 182 may have a via or other similar contact structure, such as a contact structure that penetrates the substrate 110. In some embodiments, the first and/or second interconnection lines 181 and 182 may be formed in a multi-layered structure that includes a plurality of interconnection lines connected to each other by via contacts.

As illustrated in FIG. 2, a plurality of pads is disposed on the bottom surface 112 of the substrate 110. The plurality of pads may include the ground pad 191, the test pad 192, signal pads 200, and/or power pads 210. The ground pad 191, the signal pads 200, and/or the power pads 210 may be electrically coupled to the chip 120 via bonding wires and interconnection lines in the substrate 110. In an embodiment, if the first bonding wire 123 or another bonding wire is connected to the first bonding pad 171 or the first bonding pad 171 is electrically coupled to third bonding pad 173 via the interconnection line 178 in the substrate 110 as illustrated in FIG. 1A, the ground pad 191 is electrically coupled to the chip 120 as well as the EMI shielding layer 160 through the first interconnection line 181 and the first bonding pad 171. Thus, the test pad 192 may be electrically coupled to the chip 120 through the second interconnection line 182, the second bonding pad 172, the EMI shielding layer 160, the first bonding pad 171, the interconnection line 178, the third bonding pad 173, and the first bonding wire 123.

As illustrated in FIG. 2, the plurality of pads including the ground pad 191, the test pad 192, the signal pads 200, and the power pads 210 are arranged or otherwise disposed on both edges of the bottom surface 112 of the substrate 110. Embodiments are not limited thereto, and thus other arrangements and/or layouts are possible.

In some embodiments, the ground pad 191 and the test pad 192 are spaced apart from each other, such as insulated from each other. In some embodiments, at least one additional ground pad 291 may be disposed on the bottom surface 112 of the substrate 110. The additional ground pad 291 may be electrically coupled to the chip 120 and/or the EMI shielding layer 160. In some embodiments, at least one additional test pad may be disposed on the bottom surface 112 of the substrate 110. In an embodiment, one or more additional test pads 292-1, 292-2 and 292-3 may be disposed on the bottom surface 112 of the substrate 110, as illustrated in FIG. 2. The additional test pads 292-1, 292-2, and 292-3 may be null pads corresponding to extra pads. The additional test pads 292-1, 292-2, and 292-3 may be connected to different portions, areas, or locations of the EMI shielding layer 160. Connections between the additional test pad 292-1, 292-2 and/or 292-3 and the EMI shielding layer 160 may be similar to the connection between the test pad 192 and the EMI shielding layer 160.

As described herein, one end of the EMI shielding layer 160 is electrically coupled to the first bonding pad 171 and the other end of the EMI shielding layer 160 is electrically coupled to the second bonding pad 172. Thus, a loop (e.g., a loop circuit) that includes the first interconnection line 181, the first bonding pad 171, the EMI shielding layer 160, the second bonding pad 172, and the second interconnection line 182 is formed or created between the ground pad 191 and the test pad 192. Accordingly, an electrical open/short state between the EMI shielding layer 160 and the ground pad 191 may be tested using the loop circuit, which has terminals that correspond to the ground pad 191 and the test pad 192, respectively. Using the formed loop, testing the electrical open/short state between the EMI shielding layer 160 and the ground pad 191 may be performed without directly contacting a test apparatus with the EMI shielding layer 160.

Figure 3:
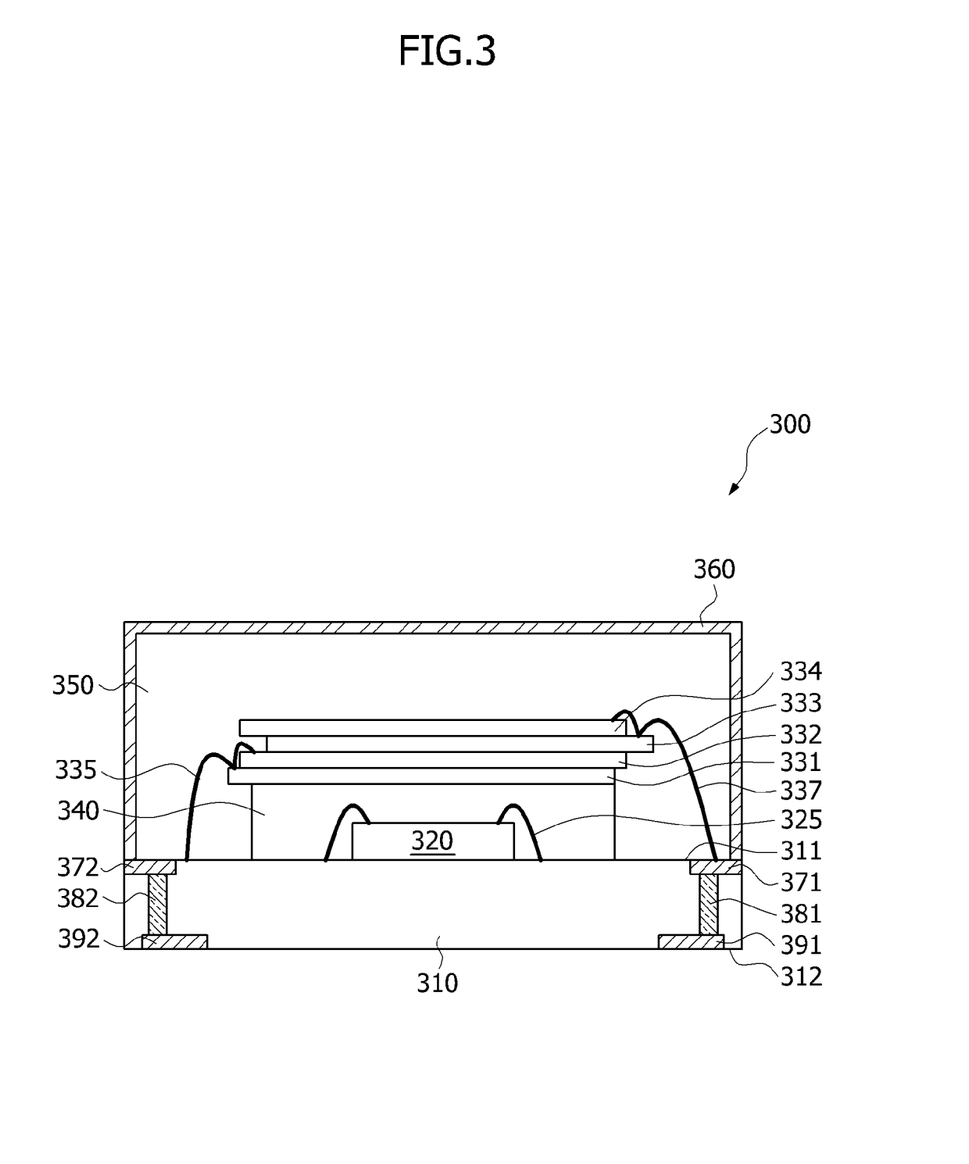
FIG. 3 is a cross-sectional view illustrating a semiconductor package according to another embodiment of the present invention.

FIG. 3 is a cross-sectional view illustrating a semiconductor package 300 according to an embodiment of the present invention. The semiconductor package 300 includes a substrate 310 having a top surface 311 and a bottom surface 312, a plurality of chips 320, 331, 332, 333 and 334 stacked on the top surface 311 of the substrate 310, an EMI shielding layer 360 disposed over the substrate 310 such that the EMI shielding layer 360 surrounds the chips 320, 331, 332, 333 and 334, a ground pad 391 disposed on the bottom surface 312 of the substrate 310, and a test pad 392 disposed on the bottom surface 312 of the substrate 310 that is spaced apart from the ground pad 391.

In some embodiments, the substrate 310 may be a package substrate that electrically connects the chips 320, 331, 332, 333 and 334 to a mother board (not shown). Although not shown in the Figures, an interconnection structure that provides various electrical signal paths may be disposed in the substrate 310. In some embodiments, the substrate 310 may be electrically coupled to another semiconductor package to constitute a package-on-package (PoP) module. A plurality of bonding pads, including first and second bonding pads 371 and 372, may be disposed in the substrate 310 to contact the top surface 311 of the substrate 310. As described with reference to FIG. 2, the signal pads 200 and/or the power pads 210, in addition to the ground pad 391 and the test pad 392, may be disposed on the bottom surface 312 of the substrate 310. Further, additional ground pads and additional test pads may be disposed on the bottom surface 312 of the substrate 310. The plurality of pads, which may include the ground pad 391, the test pad 392, the signal pads 200, the power pads 210, the additional ground pads, and/or the additional test pads, may be arranged along edges of the substrate 310, such as in the configuration depicted in FIG. 2.

A first chip 320 is disposed on the top surface 311 of the substrate 310. The first chip 320 may be electrically coupled to bonding pads (not shown) disposed in the substrate 310 to contact the top surface 311 of the substrate 310 through first bonding wires 325. In some embodiments, the first chip 320 may be a logic chip, such as a controller chip. The first chip 320 and the first bonding wires 325 may be surrounded by a first insulation layer 340. In some embodiments, the first insulation layer 340 may be a molding layer. In another embodiment, the first insulation layer 340 may be an adhesion layer such as a penetration wafer backside lamination (PWBL) tape, a P-spacer, or the like.

A plurality of second chips 331, 332, 333 and 334 are sequentially stacked on a top surface of the first insulation layer 340 opposite to the first chip 320. The second chips 331, 332, 333 and 334 may have different configurations and/or different functions than the configuration and function of the first chip 320. In some embodiments, if the first chip 320 is a logic chip, the second chips 331, 332, 333 and 334 may be memory chips. In another embodiment, the second chips 331, 332, 333 and 334 may have the same configurations and/or functions as the first chip 320.

In some embodiments, one or more of the second chips (e.g., chips 332 and 333) may be offset from the second chip 331 in a first direction (e.g., to the right in FIG. 3) to provide a step structure, and the second chip 334 may be offset from the second chip 333 in a second direction (e.g., to the left in FIG. 3) opposite to the first direction, to provide a step structure. Embodiments are not limited thereto, and thus other stack structures, including structures having more or fewer second chips and/or structures having more or fewer offsets or other geometries may be utilized.

In some embodiments, the second chips 331, 332, 333 and 334 may be disposed between the first chip 320 and the substrate 310, or the first and second chips 320, 331, 332, 333 and 334 may be laterally disposed in parallel on the substrate 310. The second chips 331 and 332 may be electrically coupled to bonding pads (not shown) disposed in the substrate 310 to contact the top surface 311 of the substrate 310 through second bonding wires 335. The bonding pads bonded to the second bonding wires 335 may be electrically coupled to the ground pad 391, the power pads, and/or the signal pads. The second chips 333 and 334 may be electrically coupled to the first bonding pad 371 through a third bonding wire 337. The first bonding pad 371 may be electrically coupled to the ground pad 391 through a first interconnection line 381.

The first insulation layer 340, the second chips 331, 332, 333 and 334, the second bonding wires 335, and the third bonding wires 337 may be surrounded or covered by a second insulation layer 350. In some embodiments, the second insulation layer 350 may be a molding layer. In another embodiment, the second insulation layer 350 may be an adhesion layer such as a penetration wafer backside lamination (PWBL) tape, a P-spacer, or the like. The EMI shielding layer 360 may be disposed on the second insulation layer 350. The EMI shielding layer 360 may include a conductive layer, such as a metal layer. The EMI shielding layer 360 may have a single layered structure or a multi-layered structure. As illustrated in FIG. 3, the EMI shielding layer 360 may be disposed to directly contact and surround or cover the second insulation layer 350. However, in some embodiments, another layer, such as a heat radiation layer, may be disposed between the EMI shielding layer 360 and the second insulation layer 350.

The EMI shielding layer 360 may be disposed to block the propagation of electromagnetic waves. In FIG. 3, the EMI shielding layer 360 surrounds or covers the chips 320, 331, 332, 333, and 334. The EMI shielding layer 360 may be electrically coupled to the ground pad 391 to block the propagation of electromagnetic waves, and may also be electrically coupled to the test pad 392 for electrical tests.

One end of the EMI shielding layer 360 is electrically coupled to the first bonding pad 371. The EMI shielding layer 360 may directly contact the first bonding pad 371. However, in some embodiments, the EMI shielding layer 360 may be electrically coupled to the first bonding pad 371 via an interconnection line. The first bonding pad 371 contacting the EMI shielding layer 360 may be electrically coupled to the ground pad 391 via the first interconnection line 381. The other end of the EMI shielding layer 360 is electrically coupled to the second bonding pad 372. The EMI shielding layer 360 may directly contact the second bonding pad 372. However, in some embodiments, the EMI shielding layer 360 may be electrically coupled to the second bonding pad 372 through an interconnection line. The second bonding pad 372 contacting the EMI shielding layer 360 may be electrically coupled to the test pad 392 via a second interconnection line 382.

As described herein, one end of the EMI shielding layer 360 is electrically coupled to the first bonding pad 371, and the other end of the EMI shielding layer 360 is electrically coupled to the second bonding pad 372. Thus, a loop including the first interconnection line 381, the first bonding pad 371, the EMI shielding layer 360, the second bonding pad 372, and the second interconnection line 382 is formed or created between the ground pad 391 and the test pad 392. Therefore, an electrical open/short state between the EMI shielding layer 360 and the ground pad 391 may be tested using the formed or created loop, which has terminals that correspond to the ground pad 391 and the test pad 392, respectively. Using the formed loop, testing the electrical open/short state between the EMI shielding layer 360 and the ground pad 391 may be performed without directly contacting a test apparatus with the EMI shielding layer 360.

Figure 4:
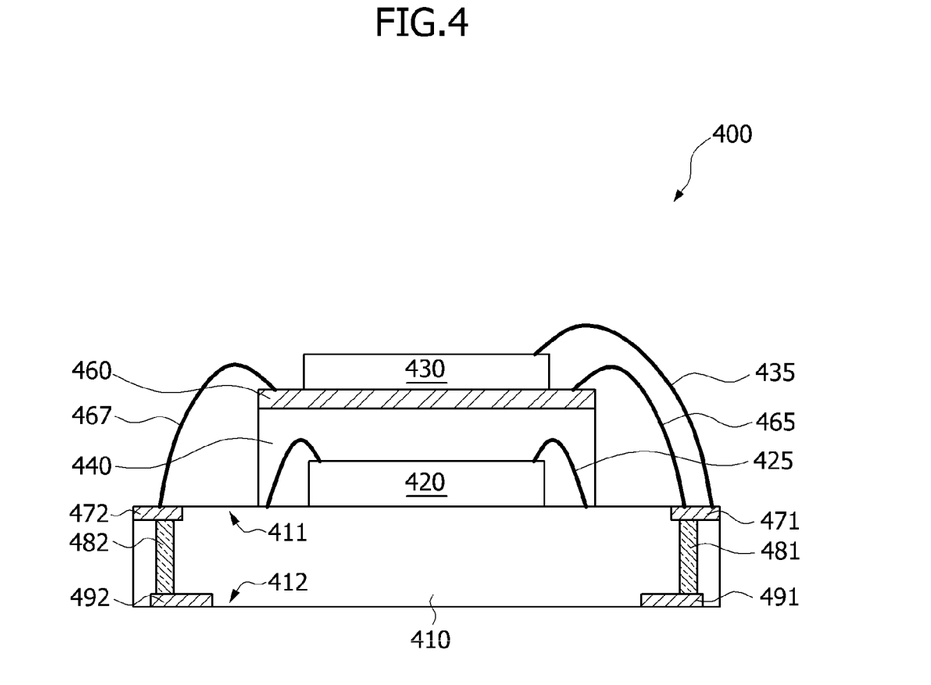
FIG. 4 is a cross-sectional view illustrating a semiconductor package according to still another embodiment of the present invention.

FIG. 4 is a cross-sectional view illustrating a semiconductor package 400 according to an embodiment of the present invention. The semiconductor package 400 includes a substrate 410 having a top surface 411 and a bottom surface 412, a first chip 420 disposed on the top surface 411 of the substrate 410, an insulation layer 440 disposed such that the insulation layer 440 surrounds the first chip 420, an EMI shielding layer 460 disposed on a top surface of the insulation layer 440 opposite to the first chip 420, a second chip 430 disposed on a top surface of the EMI shielding layer 460 opposite to the insulation layer 440, a ground pad 491 disposed on the bottom surface 412 of the substrate 410, and a test pad 492 disposed on the bottom surface 412 of the substrate 410 that is spaced apart from the ground pad 491.

In some embodiments, the substrate 410 may be a package substrate that electrically connects the chips 420 and 430 to a mother board (not shown). Although not shown in the Figures, an interconnection structure that includes various electrical signal paths may be disposed in the substrate 410. In some embodiments, the substrate 410 may be electrically coupled to another semiconductor package to constitute a package-on-package (PoP) module. One or a plurality of bonding pads, including first and second bonding pads 471 and 472, may be disposed in the substrate 410 to contact the top surface 411 of the substrate 410. In some embodiments, the signal pads 200 and/or the power pads 210 depicted in FIG. 2, in addition to the ground pad 491 and the test pad 492, may be disposed on the bottom surface 412 of the substrate 410. Further, one or more additional ground pads and/or additional test pads may be disposed on the bottom surface 412 of the substrate 410. The plurality of pads, including the ground pad 491, the test pad 492, the signal pads 200, the power pads 210, the additional ground pads, and/or the additional test pads, may be arranged along edges of the substrate 410, such as in the configuration depicted in FIG. 2.

As described herein, the first chip 420 may be disposed on the top surface 411 of the substrate 410. The first chip 420 may be electrically coupled to bonding pads (not shown) disposed in the substrate 410 to contact the top surface 411 of the substrate 410 via first bonding wires 425. Any one of the bonding pads bonded to the first bonding wires 425 may be electrically coupled to the ground pad 491, the power pads, and/or the signal pads. In some embodiments, the first chip 420 may be a logic chip, such as a controller chip. The first chip 420 and the first bonding wires 425 may be surrounded or covered by the insulation layer 440. In some embodiments, the insulation layer 440 may be a molding layer. In another embodiment, the insulation layer 440 may be an adhesion layer such as a penetration wafer backside lamination (PWBL) tape, a P-spacer, or the like. The EMI shielding layer 460 may be disposed on the insulation layer 440, and the second chip 430 may be disposed on the EMI shielding layer 460. The second chip 430 may have a different configuration and/or a different function from the first chip 420. In some embodiments, if the first chip 420 is a logic chip, the second chip 430 may be a memory chip. In another embodiment, the second chip 430 may have the same configuration and/or function as the first chip 420.

Such a configuration may suppress or limit any EMI between the first chip 420 and the second chip 430, due to the EMI shielding layer 460 being disposed between the first chip 420 and the second chip 430.

In some embodiments, the first and/or second chips 420 and 430 may include a plurality of semiconductor devices, such as devices that are vertically stacked onto one another. The second chip 430 may be electrically coupled to the first bonding pad 471 through a second bonding wire 435. The first bonding pad 471, which is connected to the second bonding wire 435, may be electrically coupled to the ground pad 491.

One end of the EMI shielding layer 460 may be electrically coupled to the first bonding pad 471 through a third bonding wire 465. In some embodiments, the EMI shielding layer 460 is electrically coupled to the first bonding pad 471 through an interconnection line having a shape that is different than a shape of the bonding wire. The other end of the EMI shielding layer 460 may be electrically coupled to the second bonding pad 472 through a fourth bonding wire 467. In some embodiments, the EMI shielding layer 460 is electrically coupled to the second bonding pad 472 via an interconnection line having a shape that is different than a shape of the bonding wire. The first bonding pad 471, which contacts the EMI shielding layer 460, may be electrically coupled to the ground pad 491 through a first interconnection line 481. The second bonding pad 472, which contacts the EMI shielding layer 460, may be electrically coupled to the test pad 492 through a second interconnection line 482.

As described herein, one end of the EMI shielding layer 460 may be electrically coupled to the first bonding pad 471, and the other end of the EMI shielding layer 460 may be electrically coupled to the second bonding pad 472. Thus, in some embodiments, a loop including the first interconnection line 481, the first bonding pad 471, the EMI shielding layer 460, the second bonding pad 472, and the second interconnection line 482 is formed or created between the ground pad 491 and the test pad 492. Therefore, an electrical open/short state between the EMI shielding layer 460 and the ground pad 491 may be tested using the loop, which has terminals that correspond to the ground pad 491 and the test pad 492, respectively. Using the formed loop, testing the electrical open/short state between the EMI shielding layer 460 and the ground pad 491 may be performed without directly contacting a test apparatus with the EMI shielding layer 460.

Figure 5:
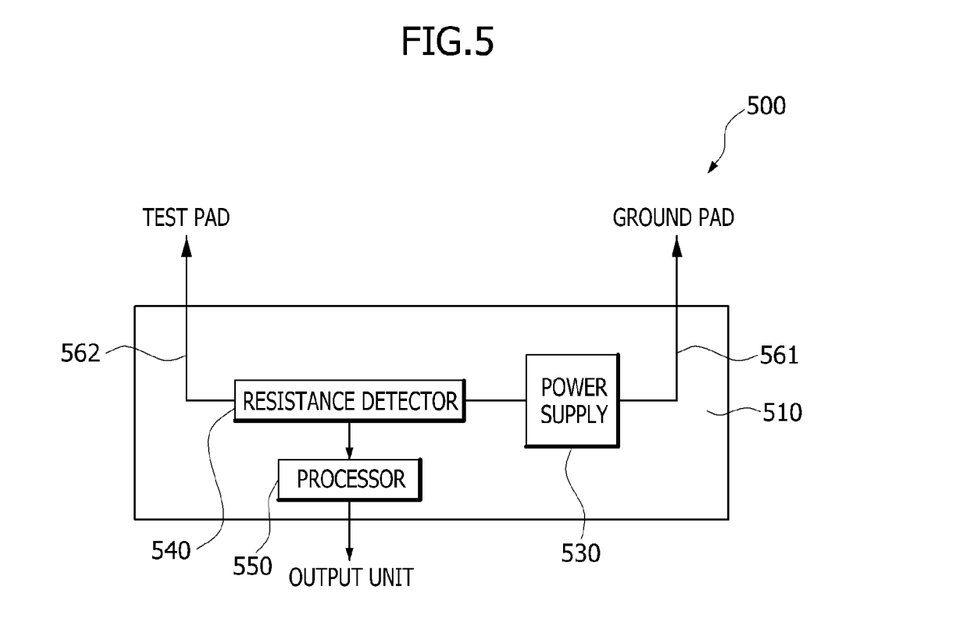
FIG. 5 is a schematic view illustrating a test apparatus used in testing semiconductor packages according to some embodiments of the present invention.

FIG. 5 depicts a test apparatus 500 used to test semiconductor packages. The test apparatus 500 includes a housing 510, a power supply 530, a resistance detector 540, and a processor 550. One or a plurality of contact members may be disposed on a top surface of the housing 510. In some embodiments, the plurality of contact members may be probe tips (e.g., probe pins) or sockets. The power supply 530 may function as a power source for forcing or placing a current into a ground pad of a semiconductor package that is being tested.

The current output from the power supply 530 is supplied to the ground pad through a first signal line 561. In some embodiments, the power supply 530 may be a current source. The resistance detector 540 may be connected to a test pad of the semiconductor package being tested. The resistance detector 540 may be connected to the test pad through a second signal line 562. The resistance detector 540 may detect a resistance value of a loop circuit in the semiconductor package, such as when the current outputted from the power supply 530 is supplied to the ground pad.

The processor 550 may estimate or otherwise determine an electrical open/short state of the loop circuit between the ground pad and the test pad in response to or based on the resistance value outputted from the resistance detector 540, and may output the estimated result to an output unit disposed outside the test apparatus 500, such as a display or reporting unit. Of course, the test apparatus 500 may include other components or configurations. In another embodiment, at least one of the power supply 530, the resistance detector 540, and the processor 550 may be separate from the housing 510, and electrically coupled to components within the housing 510.

Figure 6:
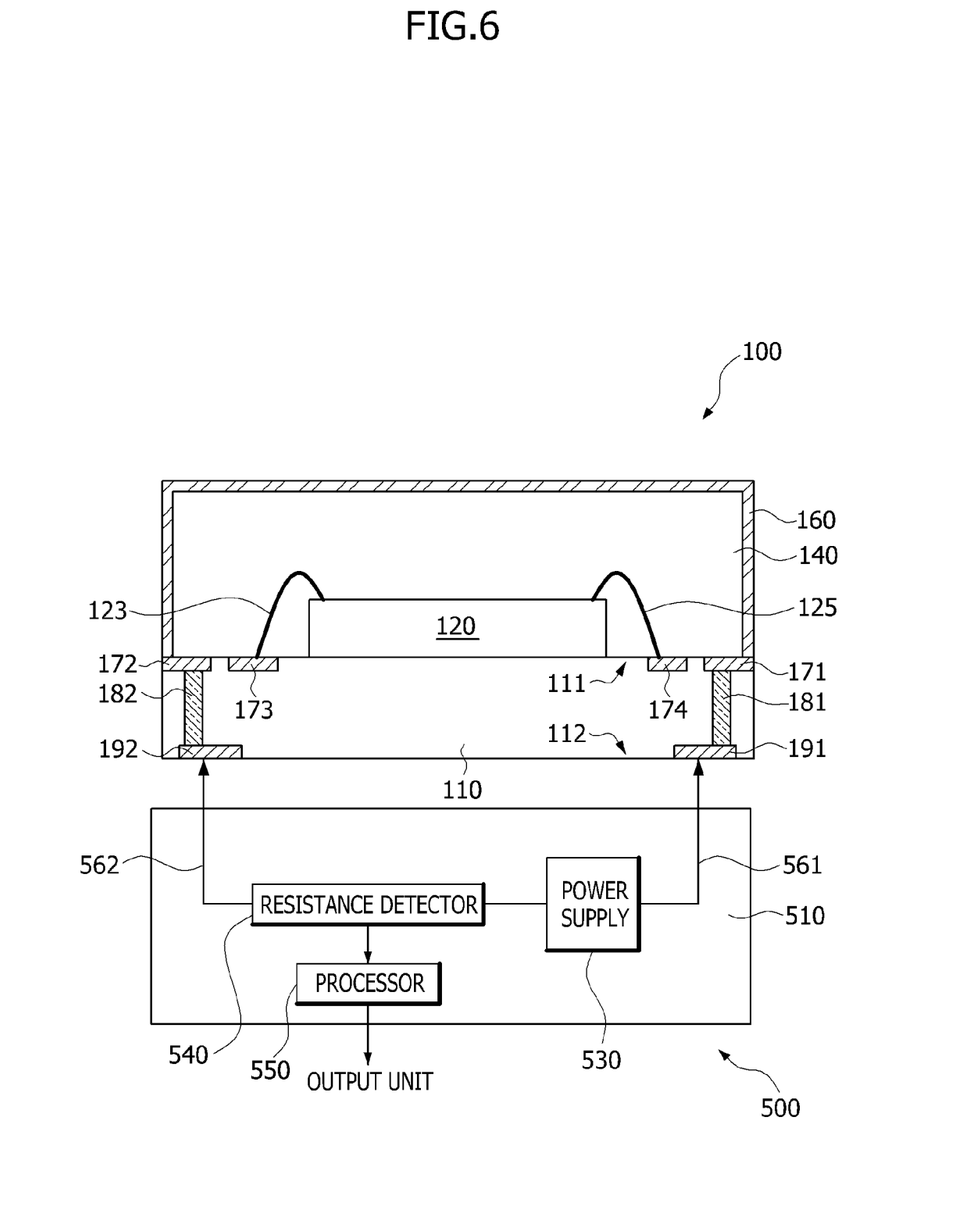
FIG. 6 is a schematic view illustrating a method of testing a semiconductor package according to an embodiment of the present invention.

FIG. 6 illustrates a method of testing the semiconductor package 100 using the test apparatus 500. The semiconductor package 100, which includes the EMI shielding layer 160, is loaded onto the test apparatus 500 to test the semiconductor package 100. In an embodiment, the ground pad 191 and the test pad 192 of the semiconductor package 100 are electrically coupled to the first signal line 561 and the second signal line 562, respectively. Thus, a closed loop circuit including the power supply 530, the first signal line 561, the ground pad 191, the first interconnection line 181, the first bonding pad 171, the EMI shielding layer 160, the second bonding pad 172, the second interconnection line 182, the test pad 192, the second signal line 562, and the resistance detector 540 is formed.

Next, the power supply 530 is turned on, and current flows into the first signal line 561. The current flows along the closed loop circuit, including the ground pad 191, the first interconnection line 181, the first bonding pad 171, the EMI shielding layer 160, the second bonding pad 172, the second interconnection line 182, the test pad 192, the second signal line 562, and the resistance detector 540. While the current flows along the closed loop circuit, the resistance detector 540 may detect and measure a resistance value of the closed loop circuit, and output the measured resistance value.

The resistance value of the closed loop circuit is received by the processor 550, and the processor 550 estimates or otherwise determines an electrical open/short state of the closed loop circuit in response to or based on the resistance value outputted from the resistance detector 540, and outputs the estimated result to an output unit located outside the test apparatus 500.

When the resistance value measured by the resistance detector 540 is greater than a predetermined value, the electrical connection state of the closed loop circuit may be regarded as being abnormal, and detailed tests may be performed to identify the abnormal connection portions of the package 100. When the resistance value measured by the resistance detector 540 is equal to or less than a predetermined value, the electrical connection state of the closed loop circuit may be regarded as being normal.

Thus, in some embodiments, the test for evaluating the electrical open/short state of the EMI shielding layer 160 may be performed using the ground pad 191 and the test pad 192 of the semiconductor package 100 (or other semiconductor packages described herein) and without directly or physically contacting the EMI shielding layer 160. Without physical or direct contact, damage to the EMI shielding layer 160 during the test operation is prevented. This test procedure may also be applicable to any one of the semiconductor packages described with reference to FIGS. 3 and 4.

Figure 7:
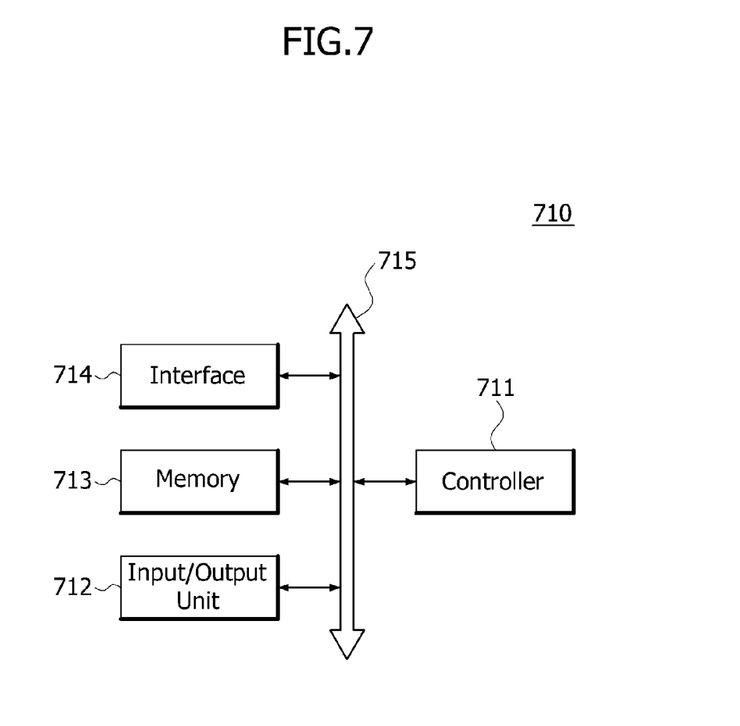
FIG. 7 is a block diagram illustrating an electronic system including a semiconductor package according to some embodiments of the present invention.

In some embodiments, the semiconductor packages having the EMI shielding layers described herein may be applied to various electronic systems. FIG. 7 illustrates an electronic system 710 that may include the semiconductor packages described herein. The electronic system 710 includes a controller 711, an input/output unit 712, and a memory component 713. The controller 711, the input/output unit 712, and the memory component 713 may be coupled with one another via a bus 715, which provides a data transmission path between components.

The controller 711 may include one or more microprocessors, one or more digital signal processors, one or more microcontrollers, one or more logic devices, or the like. The controller 711 and/or the memory component 713 may include one or more of the semiconductor packages 100, 300, and 400. The input/output unit 712 may include a keypad, a keyboard, a display device, a touch screen, or the like. The memory component 713 stores data. The memory component 713 may store data and/or commands to be executed by the controller 711.

The memory component 713 may include a volatile memory device, such as DRAM, and/or a nonvolatile memory device, such as flash memory. For example, the flash memory may be mounted to an information processing system, such as a mobile terminal or a desktop computer. The flash memory may constitute a solid-state disk (SSD). Thus, the electronic system 710 may store a large amount of data in flash memory.

The electronic system 710 may also include an interface 714 suitable for transmitting and receiving data to and from a communication network. The interface 714 may be a wired or wireless interface, and include an antenna or a wired or wireless transceiver.

The electronic system 710, therefore, may be a mobile system or device (e.g., a personal digital assistant (PDA), a portable computer, a tablet computer, a mobile phone, a smart phone, a wireless phone, a laptop computer, a memory card, a digital music system, and/or an information transmission/reception system), a personal computer or laptop, an industrial computer or server, or any other logic or computing system.

In some embodiments, the electronic system 710 may be utilized by a communication system, such as CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and/or Wibro (wireless broadband Internet).

Figure 8:
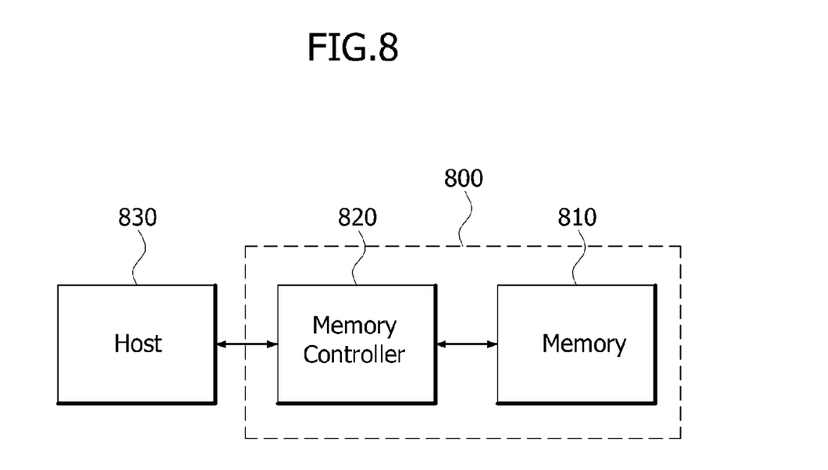
FIG. 8 is a block diagram illustrating another electronic system including a semiconductor package according to some embodiments of the present invention.

FIG. 8 illustrates a memory card 800 that may include the semiconductor packages described herein. The memory card 800 includes a memory component 810 and a memory controller 820. The memory component 810 and the memory controller 820 may store data and/or read stored data.

The memory component 810 may include a nonvolatile memory device, and the memory controller 820 may control the memory component 810 such that data is read out or data is stored in response to a read/write request from a host 830. Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the technology should be determined by the appended claims and their legal equivalents, not by the above description. All changes coming within the meaning and equivalency range of the appended claims are intended to be embraced therein.

Although a number of embodiments consistent with the technology have been described, it should be understood that numerous other modifications and embodiments can be devised by those skilled in the art that will fall within the spirit and scope of the principles of this disclosure. Particularly, numerous variations and modifications are possible in the component parts and/or arrangements, which are within the scope of the disclosure, the drawings and the accompanying claims. In addition to variations and modifications in the component parts and/or arrangements, alternative uses will also be apparent to those skilled in the art.

What is claimed is:

1. A semiconductor package comprising:
   a substrate;
   a chip disposed over a top surface of the substrate;
   an electromagnetic interference (EMI) shielding layer disposed over the substrate such that the EMI shielding layer surrounds the chip;
   a ground pad disposed in the substrate to contact a bottom surface of the substrate;
   a test pad disposed in the substrate to contact the bottom surface of the substrate and spaced apart from the ground pad;
   a first bonding pad contacting the top surface of the substrate, the first bonding pad being electrically coupled to both a first portion of the EMI shielding layer and the chip;
   a second bonding pad contacting the top surface of the substrate, the second bonding pad electrically coupled to a second portion of the EMI shielding layer;
   a first interconnection line that electrically couples the first bonding pad to the ground pad;
   a second interconnection line that electrically couples the second bonding pad to the test pad; and
   a third bonding pad electrically coupled to the chip via a first bonding wire and electrically coupled to the first bonding pad through a third interconnection line disposed in the substrate,
   wherein the ground pad is electrically coupled to both the first portion of the EMI shielding layer, via the first interconnection line and the first bonding pad, and the chip, via the first interconnection line, the first bonding pad, the third interconnection line, the third bonding pad, and the first bonding wire,
   wherein the test pad is electrically coupled to the second portion of the EMI shielding layer via the second interconnection line and the second bonding pad,
   wherein a loop circuit, which includes the first interconnection line, the first bonding pad, the EMI shielding layer, the second bonding pad, and the second interconnection line, is created between the ground pad and the test pad, such that an electrical open/short state between the EMI shielding layer and the ground pad is tested using the loop circuit,
   wherein the semiconductor package further comprises:
   at least one additional test pad disposed in the substrate to contact the bottom surface of the substrate and electrically coupled to a portion of the EMI shielding layer different from the first and second portions; and
   at least one additional ground pad disposed in the substrate to contact the bottom surface of the substrate and electrically coupled to both the EMI shielding layer and the chip, and
   wherein the test pads and the ground pads are disposed along two different edges of the bottom surface of the substrate, respectively.

2. The semiconductor package of claim 1, wherein the EMI shielding layer includes a conductive layer.

3. The semiconductor package of claim 1,
   wherein the first bonding pad directly contacts the first portion of the EMI shielding layer, and
   wherein the second bonding pad directly contacts the second portion of the EMI shielding layer.

* * * * *